United States Patent
Panella

(10) Patent No.: US 6,425,766 B1
(45) Date of Patent: Jul. 30, 2002

(54) IMPEDANCE CONTROL IN EDGE CARD CONNECTOR SYSTEMS

(75) Inventor: Augusto P. Panella, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/591,039

(22) Filed: Jun. 9, 2000

(51) Int. Cl.$^7$ .............................................. H01R 12/00
(52) U.S. Cl. ........................... 439/59; 439/60; 439/951
(58) Field of Search ........................... 439/59, 60, 951, 439/924.1, 608; 174/261

(56) References Cited

U.S. PATENT DOCUMENTS

| | | | |
|---|---|---|---|
| 5,061,190 A | * 10/1991 | Medeiors et al. | 439/60 |
| 5,468,920 A | * 11/1995 | August | 439/951 |
| 5,743,004 A | * 4/1998 | Chobot et al. | 439/608 |
| 5,772,448 A | * 6/1998 | Ekrot | 439/951 |
| 5,865,631 A | * 2/1999 | Berto et al. | 439/951 |
| 6,020,562 A | 2/2000 | Burns et al. | 174/261 |
| 6,129,555 A | * 10/2000 | Dalkuhara et al. | 438/60 |

* cited by examiner

Primary Examiner—Tho D. Ta
(74) Attorney, Agent, or Firm—Thomas D. Paulius; Charles S. Cohen

(57) ABSTRACT

A connector system including a circuit card and method of manufacturing same is provided. By way of example, the system includes a connector having an elongated housing with an elongated card-receiving slot. A plurality of signal terminals and ground terminals are mounted on the housing along the slot and have contact sections extending into the slot. A circuit card has an edge insertable into the slot, a ground plane facing a surface of the card at least near the edge and a plurality of signal contact pads and a plurality of ground contact pads along the edge for engaging the contact sections of the signal terminals and the ground terminals, respectively. The size or area of the signal contact pads is varied relative to the ground contact pads to vary the capacitance in the area of the terminal-to-circuit card interface and, thereby, vary the impedance of the system.

13 Claims, 3 Drawing Sheets

IMPEDANCE CONTROL IN EDGE CARD CONNECTOR SYSTEMS

FIELD OF THE INVENTION

This invention generally relates to the art of electrical connectors and circuit cards. Particularly, the invention relates to a system and method for decreasing the impedance through a connector to board interface by increasing the capacitance thereof.

BACKGROUND OF THE INVENTION

In today's high speed electronic equipment, it is desirable that all components of an interconnection path be optimized for signal transmission characteristics, otherwise the integrity of the system will be impaired or degraded. Such characteristics include risetime degradation or system bandwidth, crosstalk, impedance control and propagation delay. Ideally, an electrical connector would have little or no affect on the interconnection system regarding these characteristics. An ideal connector would be "transparent". In other words, the system would function as if circuitry ran through the interconnection and there would be no effect on the system whatsoever. However, such an ideal connector is impractical or impossible, and continuous efforts are made to develop electrical connectors which have as little effect on the system as possible.

Impedance and inductance control are concerns in designing an ideal connector. This is particularly true in electrical connectors for high speed electronic equipment, i.e., involving high frequencies. As example of such connectors is the popular type of electrical connector commonly called an "edge card" connector. An edge card connector is provided for receiving a printed circuit board or edge card having a mating edge and a plurality of contact pads adjacent the edge. Such edge connectors have an elongated housing defining an elongated receptacle or slot for receiving the mating edge of the printed circuit board. A plurality of terminals are spaced along one or both sides of the slot for engaging the contact pads adjacent the mating edge of the board. In many applications, such edge connectors are mounted on a second printed circuit board. The mating "edge" board commonly is called the "daughterboard", and the board to which the connector is mounted is called the "motherboard".

Another example of such connectors are board to board connectors in which a plug connector mounted on a first board has an insertion portion with terminals thereon for insertion into a receptacle connector mounted on a second board with terminals in a recess for receiving the insertion portion of the plug connector. The terminals in the plug connector mate with terminals in the receptacle connector to connect conductors on respective boards.

A problem with these connector systems as described above is that there often is an impedance mismatch between the connected boards. This impedance variance is caused by the connector having a relatively high impedance. One solution for controlling this impedance mismatch is to vary the structure of the connector, itself, and particularly the terminals of the connector. However, such changes are relatively expensive and involved. The present invention is directed to a system and a method for controlling the impedance through a connector in a very simple and inexpensive manner, by changing the configuration of the contact pads or conductors of the board itself. In essence, the capacitance of the board can be increased to decrease the impedance through the system.

SUMMARY OF THE INVENTION

An object, therefore, of the invention is to provide a new and improved system and method for controlling the impedance of a connector by varying the capacitance of the board itself.

According to one aspect of the invention, a connector system includes a connector and a circuit board. The connector includes a housing having an electronic component mating portion. A plurality of signal terminals and ground terminals are mounted on the housing along the electronic component mating portion. The terminals have contact sections extending to the mating portion. The circuit board has a first surface and a ground plane at least near said first surface and a plurality of signal conductors and a plurality of ground conductors on said first surface for engaging the contact sections of the signal terminals and the ground terminals, respectively. The signal conductors have a greater area than the ground conductors to increase the capacitance of an interface between the signal terminals and the signal conductors.

In another embodiment, a connector system includes a connector having an elongated housing with an elongated card-receiving slot. A plurality of signal terminals and ground terminals are mounted on the housing along the slot and have contact sections extending into the slot. In the preferred embodiment, the signal terminals alternate with the ground terminals along the slot. A circuit card has an edge insertable into the slot, a ground plane at least near the edge and a plurality of signal contact pads alternating with a plurality of ground contact pads along the edge for engaging the contact sections of the signal terminals and the ground terminals, respectively. The size of the signal contact pads are varied relative to the ground contact pads to vary the capacitance in the area of the terminal-to-board interface. For instance, by making the signal contact pads with greater area than the ground contact pads, the capacitance of the circuit card is increased which, in turn, decreases the impedance through the system.

In the exemplary embodiment, the signal contact pads are wider than the ground contact pads in a direction longitudinally of the edge of the circuit card. The centerline-to-centerline spacing between the signal contact pads and ground contact pads is equidistant along the edge of the card. The ground plane is embedded in the card. A plurality of the signal and ground terminals are mounted on the housing along both sides of the slot, and the circuit card has a plurality of the signal and ground contact pads on opposite sides of the card near the edge thereof.

According to another aspect of the invention, a method of manufacturing a connector system as described above, including the connector, the signal terminals and ground terminals, the circuit card and the signal and ground contact pads along the edge of the card. The method includes the steps of determining a desired impedance through the system, and selecting a given size of the signal contacts pads relative to the ground contact pads which effect a given capacitance resulting in the desired impedance.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
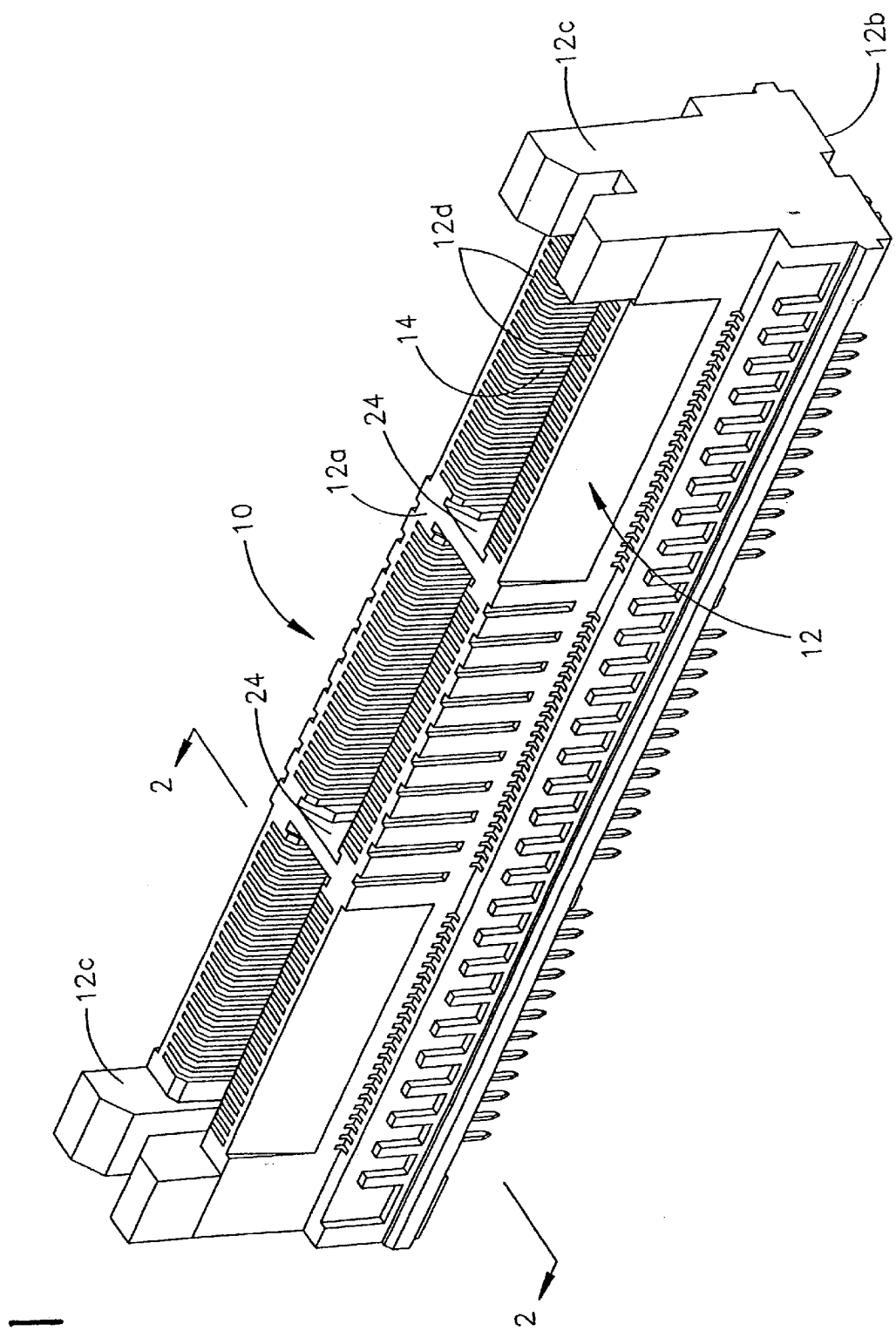
FIG. 1 is a perspective view of a connector appropriate for use with the invention.
Figure 2:
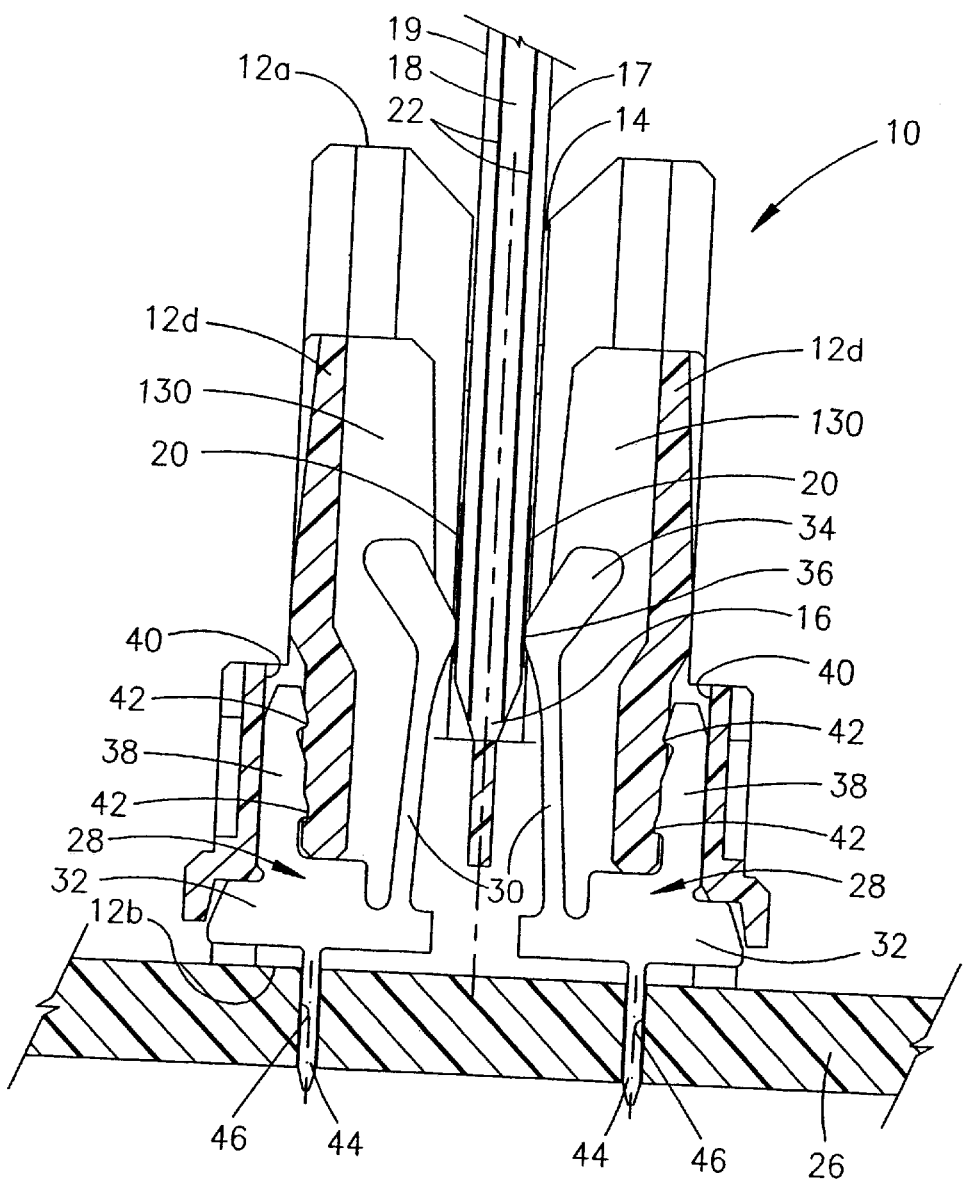
FIG. 2 is an enlarged vertical section taken generally along line 2—2 of FIG. 1, with the connector mounted on a circuit board and with a circuit card inserted into the connector.

Referring to the drawings in greater detail, and first to FIGS. 1 and 2, a connector system of the invention is applicable for use with elongated electrical connectors of the edge card type, such as a connector generally designated 10 in FIGS. 1 and 2. However, the invention is equally applicable to any connector that mates with or is mounted on a board. By way of example, an edge card connector typically includes a unitarily molded dielectric housing, generally designated 12, defining electronic component mating portions such as an edge card-receiving face 12a and a board-mounting face 12b. The edge card-receiving face includes an elongated receptacle or card slot 14 for receiving a mating edge 16 (FIG. 2) of a circuit board or edge card 18 having a plurality of contact pads 20 on opposite sides of the card near the edge. The circuit card has a pair of ground planes 22 embedded therein.

Referring back to FIG. 1, card slot 14 extends to a pair of uprights 12c of housing 12 at opposite ends of the slot. A pair of ribs 24 extend across slot 14 between opposite longitudinal side walls 12d of the housing. The housing typically is molded of dielectric material such as plastic or the like, and ribs 24 are integral with the housing and can provide a dual function of supporting the side walls as well as providing polarizing means for circuit card 18. Although not shown in the drawings herein, the circuit card will have a pair of notches in edge 16 thereof to accommodate ribs 24.

In many applications, edge card connectors, such as connector 10, are mounted on a second printed circuit board as shown at 26 in FIG. 2. The mating circuit card or edge card 18 often is called the "daughterboard", and circuit board 26 to which the connector is mounted often is called the "motherboard". It should be understood that the use of such terms as "top", "bottom", "upwardly", "downwardly", and the like are used herein to provide a clear and concise understanding of the invention in reference to the orientation of the connector and terminals in the drawings. However, these terms are not intended in any way to be limiting, because the connector obviously is usable in all kinds of omni-directional applications. Moreover, although the preferred embodiment is described with respect to a daughterboard, the present invention can be applied to the mother board 26 or any type of, circuit board.

Referring to FIG. 2, a plurality of signal terminals, generally designated 28, are mounted within terminal-receiving cavities 130 in housing 12. The cavities are spaced in pairs longitudinally of slot 14. Therefore, it can be seen that terminals 28 are mounted in the housing in pairs lengthwise of the slot, with one terminal in each pair on each opposite side of the slot. At this point, it should be understood that pairs of signal terminals 28 alternate with pairs of ground terminals (not shown) lengthwise of the housing. This is typical with many edge card connectors of the character herein. Preferably, the ground terminals are sized and configured to "shadow" the size and configuration of the signal terminals lengthwise of the slot. Therefore, the similarly shaped ground terminals are not shown and described herein.

With that understanding, each signal terminal 28 is a planar terminal blanked from conductive sheet metal material. Each terminal includes a flexible contact arm 30 projecting upwardly from an enlarged base 32 and terminating in an enlarged contact head 34. It can be seen that contact arm 30 is angled inwardly toward slot 14, and a contact point 36 inside head 34 is in engagement with one of the circuit pads 20 on the respective side of circuit card 18. Each terminal also includes a retention post 38 projecting upwardly from base 32 and into a respective mounting hole 40 in housing 12. The post has teeth 42 stamped at the inner edge thereof for skiving into the plastic material of the housing within hole 40 to retain the respective terminal in the housing, as shown. Finally, each terminal 28 includes a tail portion 44 projecting downwardly from base 32 through a hole 46 in printed circuit board 26. The tail is connected, as by soldering, to an appropriate circuit trace on the printed circuit board and/or in the hole. Although the terminals herein have tails extending through holes in printed circuit board 26, the tails could also be right-angled for surface connection to circuit traces on the top surface of the board rather than extending through holes in the board.

Figure 3:
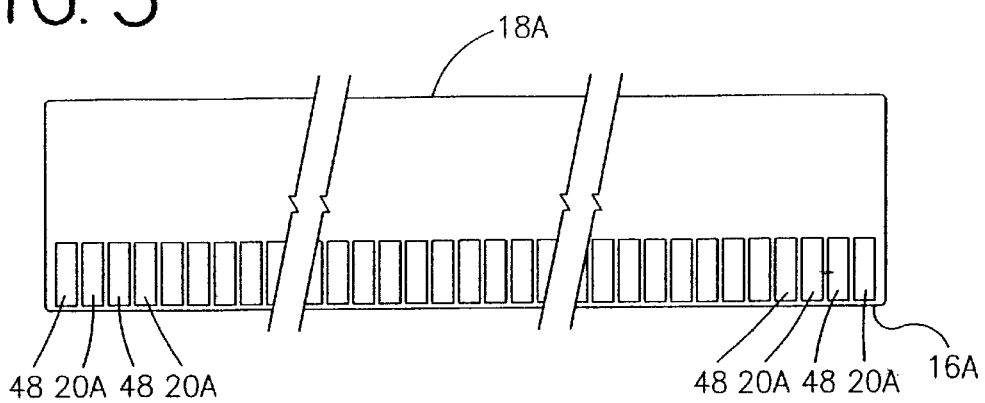
FIG. 3 is a fragmented plan view of the edge of a circuit board according to the prior art.

FIG. 3 shows a circuit card or edge card 18A according to the prior art. The circuit card has a plurality of signal conductors or contact pads 20A alternating with a plurality of ground conductors or contact pads 48 along an edge 16A of the card. It can be seen that the signal and ground contact pads are at equal pitch lengthwise of the edge of the card. It also can be seen that signal contact pads 20A are the same size and area as ground contact pads 48. This is typical of the edge cards of the prior art.

Figure 4:
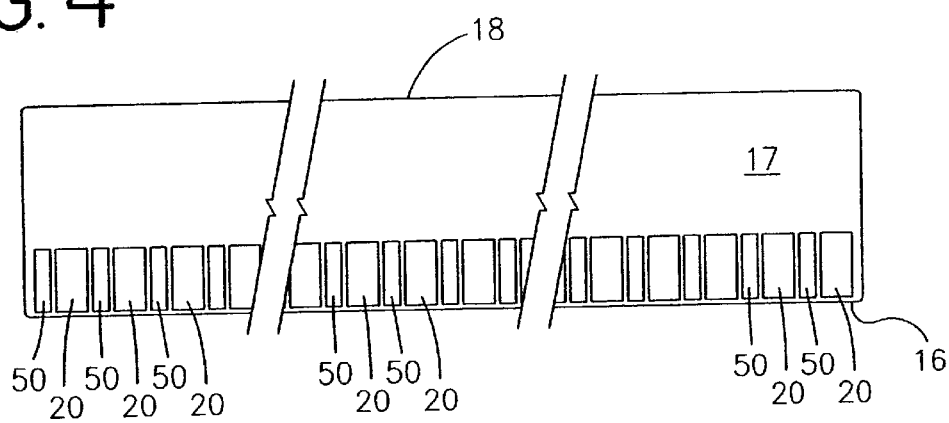
FIG. 4 is a view similar to that of FIG. 3, but of a circuit board according to the invention.
Figure 5:
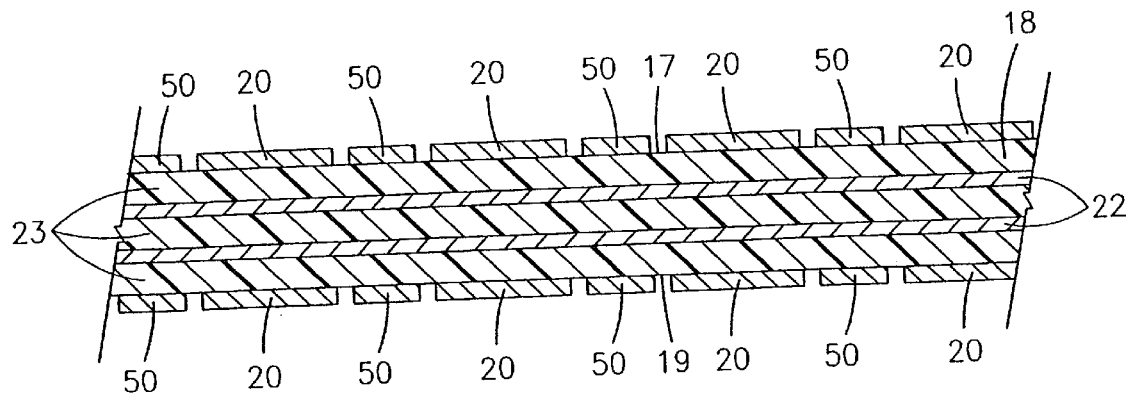
FIG. 5 is a fragmented, enlarged section through the circuit board of FIG. 4 in the area of some of the circuit pads near the edge of the board.

FIGS. 4 and 5 show circuit card or edge card 18 according to the invention, with FIG. 5 showing ground planes 22 embedded in the card between a first surface 17 and a second surface 19 and separated from each other and from the contact pads by dielectric material 23. It can be noted in FIG. 5 that the pattern of contact pads on opposite sides of circuit card 18 is the same. It should be understood that the pattern, sizes and shapes of the contact pads can be different on opposite sides of the circuit card within the concepts of the invention. Moreover, although contact pads are illustrated in FIG. 5, the invention may apply to plated through holes.

With that understanding, it can be seen in FIGS. 4 and 5 that signal contact pads 20 are of a different size or area than ground contact pads 50. The centerline-to-centerline spacing between the signal contact pads and ground contact pads may remain equidistant along edge 16 of the circuit card. In the illustrated embodiment, signal contact pads 20 have a greater area than ground contact pads 50 which results in increasing the capacitance between the signal contact pads and the adjacent ground plane 22 (FIG. 5). By increasing the capacitance in the area of the terminal-to-board interface between the signal terminals and the signal contact pads, the impedance of the connector system is reduced. Therefore, the invention contemplates the ability to "tune" the impedance of the connector system by varying the size or area of signal contact pads 20 relative to ground contact pads 50 on circuit card 18.

According to the invention, a method of fabricating a connector system is provided wherein the impedance of the system can be varied or "tuned". In particular, the method would include the steps of providing connector 10 along with signal terminals 28 and the corresponding ground terminals, in addition to circuit card 18 all as described above. A desired impedance for the connector system then is determined. A given impedance often is called the "characteristic" impedance of a circuit and usually is known. For instance, a manufacturer of electrical connectors often is provided by a customer with a characteristic impedance value of the circuit within which the customer is going to interconnect the particular connector system. The customer typically desires a connector that will match the impedance of the circuit in order to minimize its affect on the circuit. Therefore, once the desired impedance is determined, the size or area of signal contact pads 20 is selected to provide a given capacitance which results in the desired impedance. In other words, upon determining the desired characteristic impedance of the connector system during the design phase of manufacture, a desired size or area of signal contact pads 20 can be calculated. Upon building prototypes to these dimensions, the exact desired area then can be determined by testing.

Even if a customer does not provide a desired characteristic impedance, the impedance of any circuit can be measured by various means, such as a time domain reflectometer which utilizes an electric analog to a radar system, as well as other measuring or analyzing devices. The impedance of any particular connector similarly can be measured in an input-output manner, again using such instruments. If the impedance of the connector system does not sufficiently match the impedance of the interconnecting circuit, the present invention contemplates a method and system for tuning the impedance by varying the size and shape of signal contact pads 20 relative to ground contact pads 50 on circuit card 18. This system and method is considerably less expensive and more efficient than trying to change the components of the connector, itself.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An edge card for use with an edge card connector, the edge card including a card body with first and second opposing ends interconnected by an insertion edge that extends longitudinally between the first and second ends, comprising:

a plurality of conductive contact pads disposed in a row along the insertion edge, the plurality of contact pads including individual signal contact pads and ground contact pads, each of the signal and ground contact pads having a uniform height so as to define a common, upper extent of said plurality of contact pads, said signal and ground contact pads being arranged in a pattern along said insertion edge so that at least one ground contact pad is arranged adjacent to at least one signal contact pad;

the signal contact pads being wider in their extent along said insertion edge than said ground contact pads, whereby said signal contact pads have a greater conductive surface area within their common, upper extent than said ground contact pads and whereby capacitance of said signal contact pads is increased between said signal contact pads and said adjacent ground contact pads to thereby reduce impedance of said circuit card contact pads.

2. The edge card of claim 1, wherein said edge card has opposing faces that extend lengthwise between said first and second ends, and said signal and ground contact pads are arranged along said insertion edge on each of said opposing faces.

3. The edge card of claim 1, wherein said edge card body has a predetermined thickness.

4. The edge card of claim 1, wherein said signal and ground contact pads are arranged in alternating order along said insertion edge.

5. The edge card of claim 1, wherein said edge card body includes at least one ground plane disposed therewithin and spaced apart from edge card opposing faces.

6. The edge card of claim 5, wherein said edge card body includes distinct first and second ground planes disposed therewithin, the first and second ground planes being spaced apart from each other and further being spaced apart from said edge card opposing faces.

7. The edge card of claim 5, wherein said increased area signal contact pads also increase capacitance between said signal contact pads and said one ground plane.

8. A connector system with improved impedance characteristics, comprising:

a connector having an insulative housing, the housing including a body portion having at least two sidewalls that are separated by an opening disposed therebetween, said housing including a plurality of conductive terminals arranged along at least one side of the housing opening, the terminals including distinct signal terminals and ground terminals, each of said signal and ground terminals including a tail portion extending out of said housing for connecting said connector to a first circuit board;

a second circuit board having an insertion edge that extends lengthwise between two opposing ends, an edge card body having at least one mating surface that extends along said insertion edge, the second circuit board supporting a plurality of conductive contact pads along said insertion edge, the plurality of contact pads including distinct signal contact pads and ground contact pads, each of the signal and ground contact pads having a uniform height so as to define a common, upper extent of said plurality of contact pads, no portion of any of said plurality of contact pads extending beyond said common, upper extent, said signal and ground contact pads further being arranged in a pattern along said insertion edge so that at least one ground contact pad is arranged adjacent to at least one signal contact pad, said signal contact pads being wider in their extent along said insertion edge than said ground contact pads, whereby said signal contact pads have a greater conductive surface area than said ground contact pads within said common, upper extent of said plurality of contact pads, and whereby capacitance of said signal contact pads is increased between said signal contact pads and said adjacent ground contact pads to thereby reduce impedance of said circuit card contact pads.

9. The connector system of claim 8, wherein said signal and ground contact pads are arranged in alternating order along said insertion edge.

10. The connector system of claim 8, wherein said edge card body includes distinct first and second ground planes disposed therewithin, the first and second ground planes being spaced apart from each other and further being spaced apart from said at least one edge card mating surface.

11. The connector system of claim 8, wherein said signal and ground contact pads are spaced apart from each other lengthwise along said insertion edge by intervening, equal spaces.

12. The connector system of claim 8, wherein said edge card body includes at least one ground plane disposed therewithin and spaced apart from said at least one edge card mating surface.

13. The connector system of claim 12, wherein increased area signal contact pads also increase capacitance between said signal contact pads and said one ground plane.

* * * * *